United States Patent [19]

Yeats

[11] 4,355,321
[45] Oct. 19, 1982

[54] OPTOELECTRONIC ASSEMBLY INCLUDING LIGHT TRANSMISSIVE SINGLE CRYSTAL SEMICONDUCTOR WINDOW

[75] Inventor: Robert E. Yeats, San Jose, Calif.

[73] Assignee: Varian Associates, Inc., Palo Alto, Calif.

[21] Appl. No.: 230,485

[22] Filed: Feb. 2, 1981

[51] Int. Cl.³ .................. H01L 27/14; H01L 33/00
[52] U.S. Cl. ............................. 357/30; 357/17; 357/19; 350/96.14; 350/96.18
[58] Field of Search ................. 357/30, 19, 30 D, 17; 350/96.14, 96.18, 96.2; 250/551

[56] References Cited

U.S. PATENT DOCUMENTS

| | | | |
|---|---|---|---|
| 4,176,367 | 11/1979 | Uematsu | 357/19 |
| 4,186,995 | 2/1980 | Shumachu | 357/17 X |
| 4,233,619 | 11/1980 | Webb | 357/30 X |
| 4,240,090 | 12/1980 | Hughes | 357/30 |
| 4,257,672 | 3/1981 | Balliet | 350/96.2 |
| 4,295,152 | 10/1981 | Khoe | 357/30 X |
| 4,302,070 | 11/1981 | Nakayama | 357/30 X |
| 4,316,204 | 2/1982 | Inagaki | 357/17 X |

*Primary Examiner*—Martin H. Edlow
*Attorney, Agent, or Firm*—Stanley Z. Cole; Norman E. Reitz

[57] ABSTRACT

An optoelectronic assembly obtains substantially improved coupling efficiency between small core optical fibers and small area detectors and emitters. The assembly includes a housing containing an active optoelectronic device and a light transmissive single crystal semiconductor window. The light transmissive single crystal semiconductor window seals the housing and physically protects the device from the environment. The single crystal semiconductor window has an index of refraction higher than conventional glass windows, preferably greater than 2, in order to reduce beam spreading between the optical fiber and small area detectors or emitters. The window material is preferably single crystal GaP.

6 Claims, 2 Drawing Figures

OPTOELECTRONIC ASSEMBLY INCLUDING LIGHT TRANSMISSIVE SINGLE CRYSTAL SEMICONDUCTOR WINDOW

The invention herein described was made in the course of or under Contract N66001-79-C-0031 from the Department of the Navy, Office of Naval Research, Naval Oceans Systems Command.

This invention relates to packaged optoelectronic devices for use with optical fibers and, more particularly, relates to an optoelectronic assembly including a light transmissive single crystal semiconductor window in alignment with a sealed optoelectronic device.

The increasing use of optical fibers for communications has spurred the development of compatable optoelectronic components. Every optical fiber link requires an emitter and a detector (sometimes combined in a repeater module) so that there is a need to couple each optoelectronic component to the end of an optical fiber. In making these couplings, high coupling efficiency is essential especially for long distance optical fiber links. Horizontal alignment of the fiber to the optoelectronic component has been achieved by precise mechanical techniques in order to maximize the light coupled between the fiber and the optoelectronic component. Vertical alignment, i.e., positioning the end of the fiber as close as possible to the active optoelectronic device is also highly desirable, but is sometimes difficult due to a desire to not damage the device, or because of packaging constraints.

Lengths of optical fiber links have been increased by increasing the wavelength of the optoelectronic device to wavelengths on the order of 1.0 $\mu$m to 1.6 $\mu$m. At these wavelengths, compared to earlier wavelengths on the order of 0.85 $\mu$m, there is less dispersion and attenuation so that acceptable signal-to-noise ratios are retained over longer distances. This has been accomplished in part by using III-V compound detectors comprised of material such as InGaAs or InGaAsP in place of silicon.

For long distance optical fiber links, optical fibers typically have core diameters on the order of 50 to 100 $\mu$m. In order to couple light to or from the light carrying cores of such small diameter optical fibers small area light soures and detectors are generally used since small area devices offer higher performance than large area devices. For such small area light sources and detectors, it is necessary for the end of the optical fiber to be very close to the light source or detector, in order to achieve efficient coupling. Conventional glass windows that are used for enclosing and protecting optoelectronic devices are too thick (e.g., 20 mils) to allow efficient coupling between small core fibers and small area devices because the light beam spreads too much in going through such windows, with the result that the spot of light is either bigger than the fiber core (for light entering an optical fiber) or bigger than the detector (for light coming from the optical fiber). If large area devices are used performance is impaired; for example, large area photodiodes have increased capacitance and leakage current. See Also, e.g., T. P. Lee, "Recent Development in Light-emitting diodes (LED's) for optical fiber communications systems", Soc. Photo Instr. Engr. v. 224, p. 92 (1980).

It is an object of the present invention to provide an optoelectronics assembly which may be efficiently coupled to an optical fiber.

It is another object of the present invention to provide an optoelectronic assembly including a light transmissive window which substantially reduced the amount of light spreading as compared to conventional glass windows to thereby permit efficient coupling to a small area active device.

It is a still further object of the present invention to provide an optoelectronic component including a light transmissive window which protects the active device of the component from environmental hazards.

It is an additional object of the present invention to provide an optoelectronic component having a light transmissive window which has an index of refraction greater than 2.

BRIEF DESCRIPTION OF THE DRAWINGS

For a more complete understanding of the optoelectronic assembly of the present invention, reference may be had to the accompanying drawings which are incorporated herein by reference and in which.

SUMMARY OF THE INVENTION

An optoelectronic assembly is provided for obtaining substantially improved coupling efficiency between small core optical fibers and small area detectors and emitters. The assembly includes an active optoelectronic device, a housing for the device and a light transmissive single crystal semiconductor window. The single crystal semiconductor window physically protects the device from the environment. The light transmissive window has an index of refraction higher than conventional glass windows. The light transmissive window is fabricated from a single crystal semiconductor material having a refractive index greater than 2 which is capable of being fabricated in thin, small area formats such as single crystal GaP.

BRIEF DESCRIPTION OF THE PREFERRED EMBODIMENTS

Optoelectronic components for use with optical fiber links are often placed in environments where they might be damaged. They are subject to humidity, to corrosion, to becoming coated with foreign materials and to being scratched by contact with foreign objects even including the optical fiber itself. Contact with the optical fiber is a real possibility since in order to obtain efficient coupling, one attempts to position the end of the optical fiber as close as possible to the active device. (See, e.g., the end 9 of optical fiber 10 in FIG. 1.) While it is possible to encapsulate an active optoelectronic device within a transparent coating such as epoxy the protection obtained is inferior to sealing optoelectronic device packages with metal seals, especially for extreme environments, since epoxy is subject to chemical attack, is softer than most metals and outgasses, particularly at elevated temperatures.

Glass windows have been used with optoelectronic devices in packaged assemblies. See, e.g., RCA Catalog No. OPT-112C "Solid State Silicon Photodiodes". These windows are typically about 20 mils thick or more (Hermetite Corp., Avon, Mass.), and have an index of refraction of about 1.5. They are satisfactory for applications where light beams are relatively broad and emitters and detectors are not small. For example, all light may be focused onto a large detector even if the beam spreads (see FIG. 2) as it passes through the window. For long distance optical fiber links, however, such thick windows of low index of refraction are not acceptable.

Figure 1:
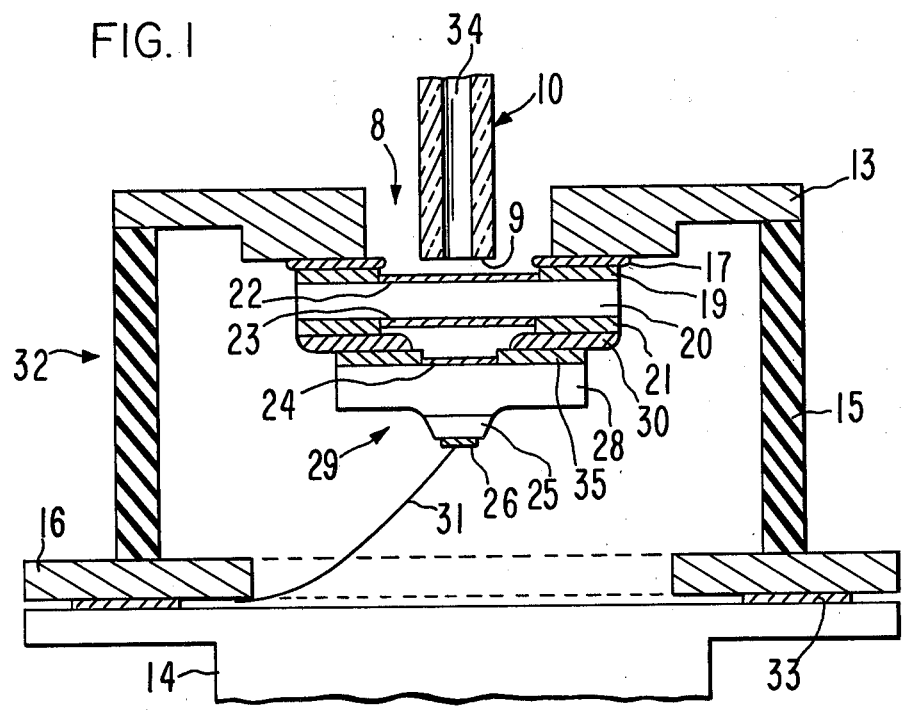
FIG. 1 is cross-sectional view of an embodiment of the optoelectronic assembly of the present invention illustrating the optoelectronic device, the light transmissive window and the housing.

The optoelectronic assembly of the present invention is shown in FIG. 1. The assembly obtains high quantum efficiency coupling (about 95%) between an optical fiber 10 and an active device 29. For empirical results see R. Yeats, et al., "Long Wavelength Detectors for Optical Fiber Communications", Soc. Photo. Instr. Engr., V. 272, to be published. Active device 29 is a photodiode consisting of transparent substrate 28 (e.g., InP), and active region 25 (e.g., $In_{0.53}Ga_{0.47}As$). Light is received from optical fiber 10 through window 20; if on the other hand active device 29 were an emitter, e.g., an LED, then light would be transmitted into optical fiber 10 through window 20. Window 20 protects device 29 in either case. The assembly consists of a housing 32, light transmissive window 20 and an active device 29. Device 29 is mounted within housing 32 opposite the opening 8 to receive light from and/or to transmit light into optical fiber 10. Light transmissive window 20 is mounted inbetween device 29 and adjacent opening 8 in order to complete the seal of housing 32 and physically protect device 29 and yet allow high coupling efficiency between the optical fiber and the active device. The end 9 of optical fiber 10 is positioned as close as possible to window 20. In practice, the fiber may be butted against window 20 and then moved off slightly so that a resting contact does not harm the optical fiber. The housing 32 is fabricated of upper metal frame 13, insulating sheath 15, lower metal frame 16 and is mounted on metal stud 14, by use of solder 33 or other means.

An opening 8, typically cylindrical, in the upper metal frame 13 permits optical fiber 10 to be inserted down close to the upper surface of transparent window 20. The light transmissive window 20 is secured by low resistance contact metalization 19 and solder 17 to the bottom of upper metal frame 13. The active device 29 is secured by low resistance contact metalizations 21 and 35, and solder 30 to the underside of the light transmissive window 20. In the embodiment shown in FIG. 1 the window seals a package containing a photodiode 29 consisting of an $In_{0.53}Ga_{0.47}As$ layer 25 grown on an InP substrate 28. This photodiode is designed for substrate-side illumination. The window is single crystal GaP which is doped n-type to $n=5\times10^{17}cm^{-3}$ to make it electrically conductive. Thus, one electrical lead of the photodiode is attached by wire bond 31 to lower metal frame 16 which is electrically connected through solder 33 or other means to metal stud 14. The other lead is connected through conductive window 20 through the solder and metalization to upper metal frame 13. The formation of such ohmic contacts is well known. See V. L. Rideout, "A Review of the Theory and Technology for Ohmic Contacts to Group III-V Compound Semiconductors", Solid State Electronics, v. 18, p. 541 (1975). In an alternative embodiment, window 20 can be made non-conductive and a conductive epoxy or wire lead can connect solder layer 30 with upper metal frame 13; or a wire bond can connect solder layer 30 with an external terminal connected through insulating sheath 15. Efficient optical coupling is aided by the use of anti-reflective coating layers 22, 23 and 24, which may be composed, for example, of silicon nitride. As is well known in the art, the thickness of the anti-reflective coating is selected to be 1/4n of the wavelength of the light to pass through the material where n is the index of refraction of the anti-reflection coating. For a wavelength of 1.3 μm, and for silicon nitride having n=2, a thickness of about 1600 Å would be required.

The selection of a material for light transmissive window 20 (FIG. 1) is based on the following criteria. The material should be transmissive to light in the regions of interest, typically 1 μm or greater. The material should be both hard and chemically resistant and susceptible to being formed in small sections. Also, it should preferably be susceptible to having an adherent metalization applied thereto to permit mounting in a metal package. In the application of FIG. 1, this metalization should also allow ohmic contact to be made to conductive GaP; in other applications it may not be necessary to form an electrical contact. Also, as discussed in detail subsequently with respect to FIG. 2, the material should have a high index of refraction (greater than about two) in order to reduce spreading of the light beam. These criteria are satisfied, for example, by single crystal semiconductor materials such as single crystal silicon, GaAs or GaP. They are readily thinned by chemical etching and polishing and may be scribed and fabricated into small area pieces. Single crystal GaP has been found to be a preferred material. GaP has a high index of refraction, $n\approx3$ in the infrared (See B. O. Seraphin and H. E. Bennett, "Optical Constants", in *Semiconductors and Semimetals*, R. K. Willardson and A. C. Beer, Eds.; Vol. 3, pp. 499 ff. (1967)), so that a light beam spreads considerably less in GaP than either in air or conventional glass windows. For example, light spreads as much in 3 mils of GaP as in only 1 mil of air (air has $n\approx1$), or 1.5 mils of glass (glass has $n\approx1.5$). Furthermore, GaP can be thinned and metalized with conventional semiconductor processing steps. GaP is hard (about as hard as quartz), chemically resistant and transparent for light having wavelengths $\geq0.55$ μm. It is transparent to the naked eye which simplifies certain alignment procedures that may occur during packaging.

For fiber optics and especially for long distance fiber optics links light beams are small, on the order of 50 to 100 μm, and the active optoelectronic device is about the same size. Thus, to insure high total quantum efficiency, it is essential that light delivered by the optical fiber reach the active device and not spill over its edges. This can only be accomplished for small area active devices (assuming a perfect horizontal alignment) if the end of the optical fiber is as close as possible to the active device e.g., if in FIG. 2, d is as short as possible, and if the horizontal spread does not cause the light beam to spill over the edge of the active device 41. For example, spread l associated with beam boundary 43 is produced by a material having a higher index of refraction than the material producing spread l' associated with beam boundary 44. Spread l produces no spillover; spread l' does produce a spillover and light is lost.

Figure 2:
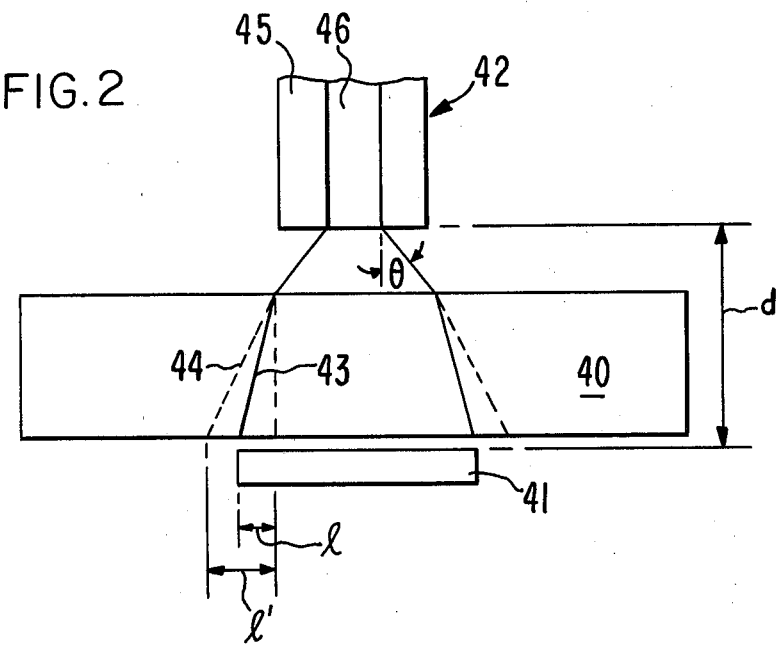
FIG. 2 is a diagram of the spreading of a light beam leaving an optical fiber and passing through a light transmissive window with ray traces being shown for windows having different incides of refraction.

For a given optical fiber the numerical aperture describes the tendency of the light beam to spread upon leaving the end of the fiber. This is a fixed value depending upon properties of the optical fiber. Thus, l' can be reduced only by having window 40 as thin as possible (while maintaining sufficient structural strength), and- /or by providing window 40 with as high as index of refraction as possible up to a practical limit determined by the performance of the anti-reflection coating. The GaP window 20 in FIG. 1 need only be about 3 mils thick for a 30 mil square area. Preferably, the window will be less than 6 mils thick. Window glasses for conventional optoelectronic assemblies have indices of refraction of about 1.5 so that indices of refraction greater than 2 offer significant improvement. Preferred single crystal semiconductor windows having thickness of about 3 mils and indices of refraction of about 3 permit nearly all light to be detected by devices of the smallest possible size. Such devices need be only slightly bigger than the core 34 (FIG. 1) of the optical fiber 10. For a fiber with a numerical aperture of 0.2, the spreading 1' in FIG. 2 is only about 5 μm for a 3 mil thick GaP window. The benefits of such windows also allow small area emitters to be efficiently coupled to small core optical fibers.

I claim:

1. An optoelectronics assembly for obtaining an efficient coupling with an optical fiber, comprising:
    a housing defining an interior cavity and having an opening in the surface thereof;
    an active optoelectronic device mounted within said housing and oriented to emit or receive light transmitted through said opening; and
    a light transmissive single crystal semiconductor window having an index of refraction greater than 2 within said housing in the vicinity of said opening so that efficient optical coupling is achieved but no physical contact is possible between said optical fiber, positioned exteriorly of said housing, and said active device within said housing.

2. An optoelectronics assembly in accordance with claim 1 wherein said light transmissive window is composed of single crystal GaP.

3. An optoelectronics assembly in accordance with claim 2 in combination with anti-reflective coatings applied to the surfaces of said light transmissive window.

4. An optoelectronics assembly in accordance with claim 2 wherein said light transmissive window is composed of single crystal silicon.

5. An optoelectronics assembly in accordance with claim 2 wherein said light transmissive window is composed of single crystal GaAs.

6. An optoelectronics assembly in accordance with claim 2 wherein said GaP is doped to be conductive and makes electrical contact with said active device and a portion of said housing so that said portion of said housing serves as one terminal of said active device.

* * * * *